(12) United States Patent
Yamamoto (10) Patent No.: US 7,216,656 B2
(45) Date of Patent: May 15, 2007

(54) SEMICONDUCTOR SUBSTRATE CLEANSING APPARATUS

(76) Inventor: Yoshiharu Yamamoto, 6-9, Nishishibukawa 1-chome Kusatsu-shi, Shiga 525-0025 (JP)

( * ) Notice: Subject to any disclaimer, the term of this patent is extended or adjusted under 35 U.S.C. 154(b) by 643 days.

(21) Appl. No.: 10/451,955

(22) PCT Filed: Sep. 10, 2001

(86) PCT No.: PCT/JP01/07814

§ 371 (c)(1),
(2), (4) Date: Jun. 27, 2003

(87) PCT Pub. No.: WO02/054472

PCT Pub. Date: Jul. 11, 2002

(65) Prior Publication Data

US 2004/0045592 A1   Mar. 11, 2004

(30) Foreign Application Priority Data

Dec. 28, 2000   (JP)   ............................. 2000-400647

(51) Int. Cl.
*B08B 3/02* (2006.01)
(52) U.S. Cl. ........................ 134/184; 134/200; 134/902
(58) Field of Classification Search ................ 134/184, 134/200, 902
See application file for complete search history.

(56) References Cited

U.S. PATENT DOCUMENTS

| | | | |
|---|---|---|---|
| 4,341,592 A * | 7/1982 | Shortes et al. ................. 134/2 |
| 5,494,526 A * | 2/1996 | Paranjpe ......................... 134/1 |
| 5,678,116 A * | 10/1997 | Sugimoto et al. ........... 396/611 |
| 5,785,068 A | 7/1998 | Sasaki et al. | |
| 5,931,721 A * | 8/1999 | Rose et al. .................... 451/89 |
| 5,975,098 A | 11/1999 | Yoshitani et al. | |
| 6,151,744 A * | 11/2000 | Ohtani et al. ................ 15/88.2 |
| 6,159,288 A * | 12/2000 | Satou et al. .................. 118/70 |
| 6,235,112 B1 * | 5/2001 | Satoh ......................... 118/300 |
| 6,446,646 B1 * | 9/2002 | Izumi .......................... 134/66 |
| 6,743,301 B2 * | 6/2004 | Matsuno et al. .............. 134/26 |

FOREIGN PATENT DOCUMENTS

| | | |
|---|---|---|
| JP | 02-001121 | 1/1990 |
| JP | 07-249606 | 9/1995 |
| JP | 09-219387 | 8/1997 |
| JP | 11-156314 | 6/1999 |
| JP | 11-176788 | 7/1999 |
| JP | 2000-015196 | 1/2000 |

\* cited by examiner

*Primary Examiner*—Frankie L. Stinson
(74) *Attorney, Agent, or Firm*—Finnegan, Henderson, Farabow, Garrett & Dunner, L.L.P.

(57) ABSTRACT

A cleansing apparatus comprising: a table 3 for supporting a semiconductor substrate 30 horizontally; a high frequency solution injector 20 capable of injecting a solution to the upper surface 30a and the side surface 30c of the semiconductor substrate 30 supported by the table 3 with the application of vibration at high frequency; a cover 2 capable of tightly enclosing the semiconductor substrate 30 supported by the table 3; and pressure reducing means 18 for reducing the pressure in a space, in which the semiconductor substrate 30 is enclosed with the cover 2. The semiconductor substrate can be cleansed efficiently at a low cost and kept in clean state after the cleansing until it is dried.

12 Claims, 7 Drawing Sheets

SEMICONDUCTOR SUBSTRATE CLEANSING APPARATUS

TECHNICAL FIELD

The present invention relates to an apparatus for cleansing a semiconductor substrate.

BACKGROUND ART

As an apparatus for cleansing semiconductor substrates one by one, there has been conventionally an apparatus for cleansing a semiconductor substrate by injecting a cleansing solution with application of vibration at high frequency from above the semiconductor substrate while stopping or turning the semiconductor substrate (see Japanese Patent Application Laid-open No. 156,314/1999). Thereafter, the semiconductor substrate is drained by centrifugal force while being turned, and then, is dried. Otherwise, after the semiconductor substrate is drained to such an extent as not to allow the solution to drip down on a floor during transportation, the semiconductor substrate is transported from a cleansing chamber to a drying chamber, and then, the drying chamber is tightly closed and reduced in pressure, followed by a drying treatment.

However, the drying only by draining is insufficient. Furthermore, when the semiconductor substrate is transported to the drying chamber after the draining, the semiconductor substrate may be half dried during the transportation, or only minute droplets may remain at the surface of the semiconductor substrate. If the semiconductor substrate is exposed to the atmosphere in this state, an oxide film may be formed at or a floating contamination may adhere to the surface of the semiconductor substrate. Such an oxide film or a contamination may become an inhibiting factor in an etching process thereafter, thereby degrading the characteristics of a semiconductor device.

Thus, an object of the present invention is to provide a cleansing apparatus capable of efficiently cleansing a semiconductor substrate at a low cost and drying the semiconductor substrate after the cleansing treatment while keeping the cleanness.

DISCLOSURE OF THE INVENTION

A cleansing apparatus according to the present invention comprises:

a table for supporting a semiconductor substrate horizontally;

a high frequency solution injector capable of injecting a solution to the upper surface of the semiconductor substrate supported by the table with the application of vibration at high frequency;

a cover capable of tightly enclosing the semiconductor substrate supported by the table;

pressure reducing means for reducing the pressure in a space, in which the semiconductor substrate is enclosed with the cover; and a container for containing therein the table, the high frequency solution injector and the cover.

The apparatus according to the present invention comprises the cover capable of tightly enclosing the semiconductor substrate supported by the table. During a drying treatment, the semiconductor substrate is tightly enclosed with the cover, and then, the semiconductor substrate is dried by reducing the pressure of the enclosed space by pressure reducing means such as a vacuum pump. Therefore, it is unnecessary to move the semiconductor substrate per se to another location for the purpose of the drying treatment. That is to say, both of the cleansing treatment and the drying treatment are performed inside of one treatment chamber enclosed by the container. Consequently, the semiconductor substrate need not be drained, and further, moisture is kept on the semiconductor substrate till the start of the drying treatment since the semiconductor substrate is supported horizontally. As a result, the semiconductor substrate can be dried while keeping the cleanness even after the cleansing treatment by the apparatus according to the present invention. Thus, it is possible to prevent any formation of an oxide film on the semiconductor substrate or any adhesion of a contamination to the semiconductor substrate. Furthermore, since the space in which the pressure is reduced is formed not in the entire treatment chamber enclosed by the container but inside of the cover, the pressure can be speedily reduced. Moreover, since only the inside of the cover is reduced in pressure, only the cover is designed in such a manner as to sufficiently endure the pressure reduction.

DETAILED DISCLOSURE OF THE INVENTION

According to the present invention, it is desirable that the table should be turned. In this case, a cleansing solution injected onto a semiconductor substrate is dispersed by centrifugal force generated at the time of turn so that the entire semiconductor substrate can be cleansed by cleansing the semiconductor substrate while turning it. Therefore, it is possible to uniformly cleanse the entire semiconductor substrate with efficiency. Here, in order to prevent moisture on the semiconductor substrate from being spattered out after a cleansing treatment, the turn of the table is controlled in such a manner as to be stopped before the completion of the injection of the solution. In the case where the table can be turned, an effect can be produced in the drying treatment since the moisture is spattered by the centrifugal force generated by the turn of the semiconductor substrate.

It is preferable that the high frequency solution injector can be moved in parallel to the table, and further, can be inclined with respect to the table. Consequently, the high frequency solution injector can be moved in parallel to the table to the margin of the semiconductor substrate during the cleansing treatment, and therefore, the semiconductor substrate can be cleansed more uniformly. Furthermore, the high frequency solution injector is inclined with respect to the table after it is moved to the margin of the semiconductor substrate, so that the side surface of the semiconductor substrate can also be cleansed sufficiently.

Moreover, the high frequency solution injector is moved after the cleansing treatment, thereby reducing the volume of the space around the semiconductor substrate tightly enclosed with the cover. Therefore, the tight closure becomes easy, which is an advantage in designing the apparatus. In order to move and incline the high frequency solution injector in the above-described manner, it is preferable that there should be provided, for example, a swing shaft for swinging the high frequency solution injector within a plane parallel to the table; and an arm which is fixed at one end thereof perpendicularly to the swing shaft and has at the other end thereof the high frequency solution injector oscillatably fixed thereto.

The high frequency solution injector has a supply port and a nozzle, and includes a vibrator for propagating high frequency vibration in the solution. The solution such as a cleansing solution which is pressurized by pressurizing means such as a pump is supplied through the supply port, and then, the solution is injected through an injection port of the nozzle while the solution is vibrated at the high frequency by means of the vibrator.

The shape of the injection port of the high frequency solution injector is not particularly limited, and it should be preferably, for example, a small circle. This case has an advantage in concentrically cleansing a part on the semiconductor substrate. Other examples of the shape of the injection port include a slit. This shape has an advantage in cleansing the semiconductor substrate in a short time. For example, when the high frequency solution injector can be moved in parallel to the table and the semiconductor substrate is formed into a circle, the length of the slit-shaped injection port is made greater than the diameter of the semiconductor substrate. During the cleansing treatment, the high frequency solution injector is allowed to be turned from one end to the other end of the semiconductor substrate while the cleansing solution is injected. In this manner, the entire upper surface of the semiconductor substrate can be cleansed over by only one turning motion.

In contrast, when the table can be turned and the semiconductor substrate is formed into a circle, the length of the slit-formed injection port is made greater than the radius of the semiconductor substrate. The high frequency solution injector is set in such a manner that one end of the injection port is located above the center of the semiconductor substrate. In this manner, the entire upper surface of the semiconductor substrate can be cleansed over by only one turn of the semiconductor substrate. Furthermore, since the cleansing solution is injected at the center of the upper surface of the semiconductor substrate all the time during the cleansing treatment, the cleansing solution never becomes short at the center even if the cleansing solution on the semiconductor substrate is dispersed toward a marginal portion by the turn. Here, in order to inject the cleansing solution in the uniform amount from the center of the semiconductor substrate to the marginal portion thereof, the opening width of the slit-shaped injection port is varied along a longitudinal direction. Specifically, it is preferable that the opening width should be made smaller at the center; in contrast, it should be greater at the marginal portion.

In order to propagate the high frequency over the entire injected cleansing solution in the case where the injection port of the high frequency solution injector is large, the high frequency solution injector may be provided with a plurality of vibrators for vibrating the solution at a plurality of portions at the high frequency. In this manner, the high frequency solution injector can be fabricated at a reduced cost in comparison with the case where there is provided a single large vibrator. Furthermore, when there are provided a plurality of vibrators, the cleansing force can be adjusted by independently setting an output of each of the vibrators.

In order to meticulously cleanse the semiconductor substrate and secure air-tightness inside of the container, it is desirable that the cleansing apparatus should further comprise: a plurality of branch pipes for supplying a plurality of kinds of chemical solutions, respectively; valves disposed in the branch pipes, respectively; confluent units for allowing the chemical solutions passing through the valves to be made confluent with each other; and a single main pipe passing through the container so as to connect the confluent units and the high frequency solution injector to each other. With this configuration, the plurality of different kinds of chemical solutions can be supplied at a desired concentration by switching the valves, and then, the cleansing solution can be prepared. Furthermore, the air-tightness inside of the container can be readily kept since only the main pipe penetrates the container.

It is preferable that the cover should be located apart from the semiconductor substrate during the cleansing treatment in such a manner as to prevent any interference with the high frequency solution injector and should be moved so as to tightly enclose the semiconductor substrate during the drying treatment. The cover is moved perpendicularly to the table by providing means for achieving a linear motion such as an air cylinder or a ball screw.

Moreover, the cover having such a shape and a size as to contain therein also the high frequency solution injector is used. The high frequency solution injector may not be moved, but may be tightly enclosed together with the semiconductor substrate. In this manner, it is possible to more simplify the design of the apparatus since only the cover is moved during the drying treatment. Furthermore, the cleansing treatment and the drying treatment can be performed in various modes. For example, the semiconductor substrate and the high frequency solution injector are tightly enclosed with the cover after the cleansing solution is injected onto the semiconductor substrate by the high frequency solution injector. In this state, pure water can be injected onto the semiconductor substrate, followed by reducing pressure and drying. In this manner, the semiconductor substrate is dried before the drying treatment, so that the semiconductor substrate can be prevented from being brought into contact with gas similar to the atmosphere. Thus, the cleanness immediately after the cleansing treatment can be kept till the completion of the drying treatment.

Additionally, in the case where the table can be turned, it is preferable that the pressure should be reduced during the drying treatment while the table is turned. As described above, since the moisture is spattered by the centrifugal force generated by the turn of the semiconductor substrate, the semiconductor substrate can be dried more speedily. Moreover, in order to prevent any oxidation caused by the contact of the semiconductor substrate with oxygen during the drying treatment, it is preferable that the atmosphere inside of the tightly enclosed space should be changed over by introducing inactive gas such as $N_2$ or Ar.

According to the present invention, it is desirable that the container containing therein the high frequency solution injector and the cover should shield against the outside air. Consequently, it is possible to prevent the semiconductor substrate from being brought into contact with the outside air. In the case where a rotary shaft is provided for turning the table and penetrates the container, two or more sealing parts or sealing mechanisms are provided for tightly enclosing the rotary shaft. Furthermore, it is preferable that pressure reducing means should be provided for reducing the pressure in a space defined between the sealing parts or the sealing mechanisms. Here, it is preferable that the sealing part should have a small contact pressure so as to prolong a lifetime and reduce the dust generating quantity caused by abrasion. Otherwise, it is preferable that the sealing mechanism should be of a non-contact type. Although the pressure to be reduced in the sealing parts is not limited, it is desirable that the pressure should be reduced down to the same level or less when the inside of the treatment chamber or cover is reduced in pressure. Thus, it is possible to prevent the outside air or abrasive powder of the sealing part from intruding into the inside of the treatment chamber or the cover.

BEST MODES FOR CARRYING OUT THE INVENTION

First Embodiment

Figure 1:
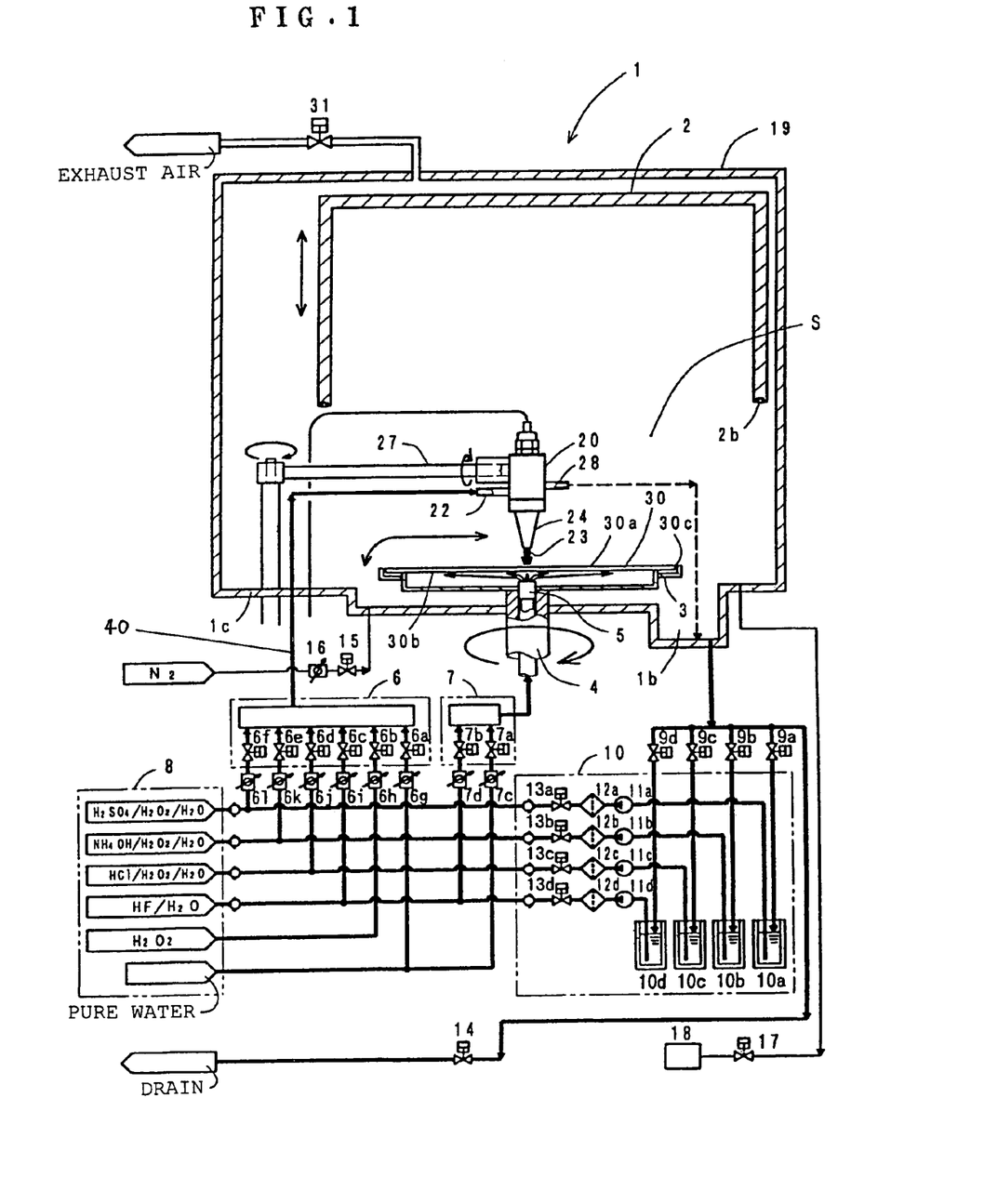
FIG. 1 is a cross-sectional view showing a cleansing apparatus in a first Embodiment.

FIG. 1 is a cross-sectional view showing a cleansing apparatus in a first Embodiment.

The cleansing apparatus 1 is provided with a container 19. A treatment chamber S is enclosed and defined by the container 19. The container 19 shields against outside air so as to keep the treatment chamber S in an airtight state. The apparatus 1 is provided with a circular turnable table 3 for horizontally supporting a circular semiconductor substrate 30. The table 3 is formed into a shape in which the center thereof is recessed more than the marginal portion thereof, and therefore, it supports the substrate 30 at the marginal portion thereof. At the center of the lower surface of the table 3 is securely fixed a hollow rotary shaft 4.

Figure 2:
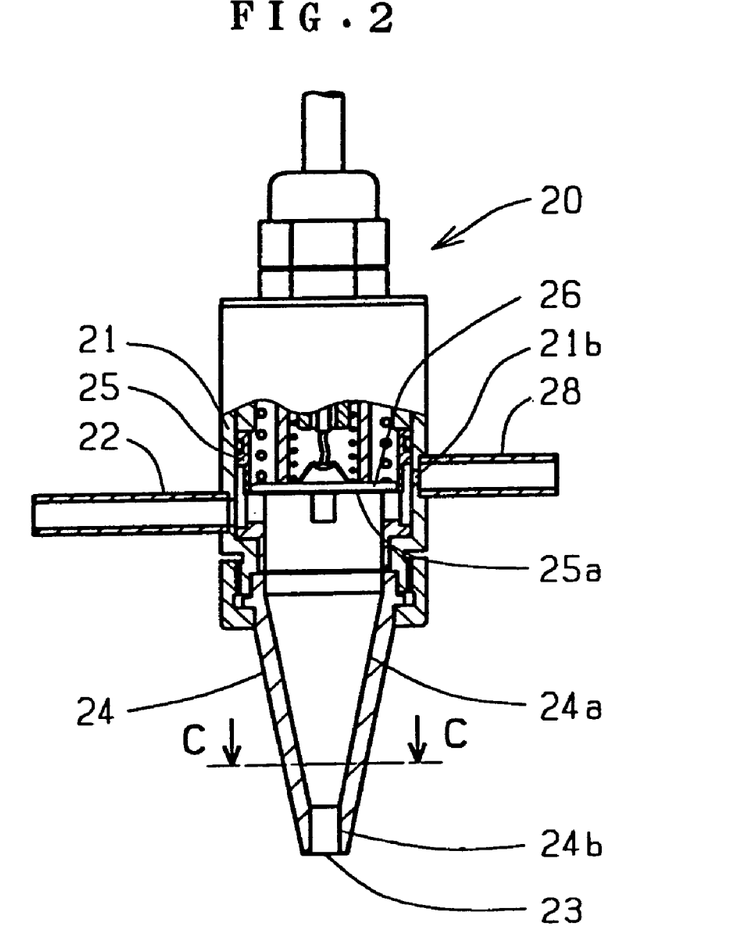
FIG. 2 is a partly cross-sectional view showing a high frequency solution injector in the first Embodiment.
Figure 3:
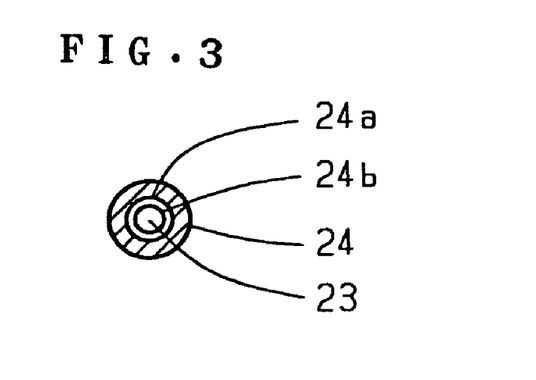
FIG. 3 is a cross-sectional view taken along a line C—C in FIG. 2.

Above the table 3 is provided a high frequency solution injector 20. FIG. 2 is a partly cross-sectional view showing the injector 20; and FIG. 3 is a cross-sectional view taken along a line C—FIG. 2. The injector 20 includes a cylindrical case 21 and a nozzle 24 disposed in the case 21. The case 21 is provided with a supply port communicating with a supply pipe 22, and thus, a cleansing solution is supplied through the supply port. The supplied cleansing solution is injected onto the semiconductor substrate 30 through an injection port 23 formed at the nozzle 24. The case 21 contains therein a vibrator 26, which is vibrated at a high frequency from 800 kHz to 2 MHz, a holder 25, which is made of a chemically resistant material and liquid-tightly supports the vibrator 26, and an O-ring. The vibrator 26 is bonded to the bottom of the holder 25. Therefore, when the vibrator 26 is vibrated, the lower surface 25a of the holder 25 is vibrated together. Consequently, the supplied cleansing solution is brought into contact with the lower surface 25a, and then, is injected while being vibrated at the high frequency. Thus, cleansing ability can be enhanced.

In the injector 20, a passage in the nozzle 24 consists of a first passage 24a whose inner diameter is gradually decreased toward the injection port 23 and a second passage 24b whose inner diameter is uniform and which is continuous from the first passage 24a to the injection port 23. Therefore, the momentum of the cleansing solution is increased when the cleansing solution passes through the first passage 24a, and subsequently, the proceeding direction of the cleansing solution is made constant when the cleansing solution passes through the second passage 24b. Consequently, the injector 20 can inject the cleansing solution straight at a long and stable distance of a cleansing effective portion with substantially constant cleansing ability.

The case 21 has a discharge port 21b communicating with a discharge pipe 28. The discharge port 21b is located above the lower surface 25a of the holder 25, that is, a solution contact surface, over which the high frequency is propagated. Therefore, bubbles generated in the cleansing solution cannot stay at the lower surface 25a, but ascend by its own buoyant force and the inside pressure of the cleansing solution inside of the case 21, and then, are discharged through the discharge port 21b. Consequently, in the injector 20, it is possible to prevent the vibrator 26 from being idly vibrated, so as to prevent any injection of the bubbles together with the cleansing solution. The injector 20 is oscillatably (i.e., in a swingable manner) connected to the end of an arm 27, which is connected at the other end thereof to a rotary shaft perpendicular to the table 3. Thus, the injector 20 can swing and incline within the plane parallel to the table 3 and the substrate 30.

The apparatus 1 is provided with a lower nozzle 5 independently of the injector 20. The lower nozzle 5 is contained inside of the rotary shaft 4 in an upward facing manner with the end thereof penetrating the bottom of the table 3. When the cleansing solution is supplied to the lower nozzle 5, the cleansing solution is injected onto the lower surface 30b of the substrate 30.

In the apparatus 1, the cleansing solutions supplied to the injector 20 and the lower nozzle 5 are prepared in a first confluent unit 6 and a second confluent unit 7, which use a chemical solution unit 8 installed independently of the apparatus body as a supply source. The chemical solution unit 8 is constituted of six tanks, in which chemical solutions such as a sulfuric acid hydrogen peroxide solution ($H_2SO_4/H_2O_2/H_2O$), an ammonia hydrogen peroxide solution ($NH_4OH/H_2O_2/H_2O$), a hydrochloric acid hydrogen peroxide solution ($HCl/H_2O_2/H_2O$), a fluoric acid solution ($HF/H_2O_2$) and a hydrogen peroxide solution ($H_2O_2$), and pure water are reserved, respectively, as treatment solutions. Incidentally, although the aforementioned chemical solutions are used as the treatment solutions in the present Embodiment, the kinds of treatment solutions may be varied according to the types of cleansing treatment, one or more out of the aforementioned chemical solutions may be omitted, or other treatment solutions may be added.

Each of the tanks in the chemical solution unit 8 communicates with the first confluent unit 6. The chemical solutions or the pure water supplied from the tanks are made confluent in the first confluent unit 6, thereby preparing the cleansing solution, which is then supplied to the injector 20 through a main pipe 40. Furthermore, the kinds and quantities of chemical solutions to be made confluent can be adjusted by controlling switch valves 6a, 6b, 6c, 6d, 6e and 6f and regulators 6g, 6h, 6i, 6j, 6k and 6l in the present Embodiment, and therefore, a plurality of kinds of cleansing solutions can be prepared.

The tanks for the fluoric acid solution and the pure water out of the tanks in the chemical solution unit 8 communicate with also the second confluent unit 7. In the same manner as in the first confluent unit 6, a plurality of kinds of cleansing solutions can be prepared by controlling switch valves 7a and 7b and regulators 7c and 7d in the second confluent unit 7. The prepared cleansing solution is supplied to the lower nozzle 5 from the unit 7. Incidentally, although the tanks for the fluoric acid solution and the pure water communicate with the second confluent unit 7 in the present Embodiment, the other tanks in the chemical solution unit 8 may communicate with the unit 7 according to the type of the cleansing treatment at the lower surface 30b of the substrate 30.

In the apparatus 1, the cleansing solutions injected from the injector 20 and the lower nozzle 5 are once collected in a drain outlet 1b formed inside of the apparatus body. And then, the cleansing solutions are drained to the outside of the apparatus by opening a switch valve 14, or are recovered in a recycle unit 10 by opening switch valves 9a, 9b, 9c and 9d. The recycle unit 10 includes tanks 10a, 10b, 10c and 10d for reserving the recovered cleansing solutions therein, pumps 11a, 11b, 11c and 11d for sucking the cleansing solutions from the tanks, filters 12a, 12b, 12c and 12d for removing contaminations contained in the cleansing solutions and switch valves 13a, 13b, 13c and 13d communicating with the first and second confluent units 6 and 7. When the cleansing solutions are recovered, a metallic ion or the like may be removed by a circulating and filtrating device or the like by utilizing a high temperature distillation technique, before the cleansing solutions may be separated from each other, to be then introduced into the reservoir tanks 10a, 10b, 10c and 10d.

Here, the supply of the cleansing solutions to the injector 20 and the lower nozzle 5 and the discharge of the bubbles generated in the cleansing solution from the injector 20 are performed via tubes connected to the injector 20 and the lower nozzle 5. The tube is made of Teflon (registered trademark), and therefore, is excellent in chemical resistance and flexibility. Thus, the tube cannot be corroded even if it is brought into contact with the cleansing solution, and further, it cannot restrain the movement of the injector 20.

Additionally, the apparatus 1 is provided with a cover 2 just above the table 3. The cover 2 is formed into a shape of a column having one surface opened, and has a space, in which the table 3 and the semiconductor substrate 30 can be contained. Moreover, the cover 2 can be elevated in a direction perpendicular to the table 3 by an air cylinder (not shown), and has an air-tight seal 2b at the lower end thereof. Consequently, the table 3 and the semiconductor substrate 30 can be tightly enclosed by descending the cover 2.

Furthermore, the apparatus 1 is provided with a vacuum pump 18 and an $N_2$ supply port. The vacuum pump 18 and the $N_2$ supply port communicate with a floor face 1c inside of the cover 2 via a switch valve 17, and another switch valve 15 and a regulator 16, respectively. Consequently, in the apparatus 1, the space tightly closed with the cover 2 can be reduced in pressure, and further, $N_2$ can be introduced into the space.

The apparatus 1 is operated in a manner described below.

First, the injector 20 is set on the semiconductor substrate 30, and the cover 2 is set further above. The cleansing solutions are prepared in the first and second confluent units 6 and 7. At the same time when the table 3 is turned, the cleansing solutions are injected from the injector 20 and the lower nozzle 5. The prepared cleansing solutions are varied per predetermined period of time, and are sequentially injected. While the injector 20 injects the cleansing solution, it reciprocates between the center of the semiconductor substrate 30 and the margin thereof. The turning speed of the table 3 is varied according to a distance between the injector 20 and the center of the semiconductor substrate 30. Furthermore, the table 3 can be turned while the substrate 30 is deviated. Consequently, it is possible to uniformly cleanse the entire upper surface 30a of the substrate 30. When the injector 20 reaches the margin of the substrate 30, it is inclined to then inject the cleansing solution toward the side surface of the substrate 30.

Steam generated in the cleansing solution is discharged through a discharge port via a switch valve 31 disposed at the upper portion of the apparatus. Upon the completion of treatment with the cleansing solution, the injector 20 and the lower nozzle 5 inject only the pure water, thereby performing a rinsing treatment for washing out the cleansing solution adhering to the substrate 30. After a lapse of a predetermined time, the table 3 is stopped while its turn is gradually reduced in speed. After a while, the injector 20 and the lower nozzle 5 stop the injection. In this manner, the liquid film of the pure water remains at the upper surface 30a of the substrate 30. Thereafter, the injector 20 is moved outside of the cover 2, and then, is stopped.

Next, $N_2$ starts to be introduced. At the same time, the cover 2 is descended down. When the table 3 and the substrate 30 are tightly enclosed with the cover 2, the vacuum pump 18 starts to operate, and thus, gas staying inside of the airtight space is sucked. At this time, the suction amount is made greater than the $N_2$ introducing amount. When the $N_2$ concentration inside of the airtight space reaches a preset value, the introduction of $N_2$ is stopped, so that the airtight space is reduced in pressure. Thereafter, the table 3 is turned again, and thus, the pure water adhering onto the substrate 30 is spattered by centrifugal force. Consequently, the substrate 30 is dried. After a lapse of a predetermined period of time, the turn of the table 3 and the drive of the vacuum pump 18 are stopped.

In the apparatus 1, the injector 20 and the lower nozzle 5 inject the cleansing solutions, thereby cleansing the semiconductor substrate 30. Furthermore, the injector 20 injects the cleansing solution while exciting the cleansing solution at high frequency. During the cleansing treatment, the substrate 30 is turned. Therefore, the cleansing efficiency is high in the apparatus 1. Thus, it is possible to reduce the concentration of the cleansing solution and set the cleansing treatment temperature to room temperature. Furthermore, the amount of pure water is small, and the danger level of the cleansing solution and its steam is low. Moreover, since the injector 20 discharges the bubbles generated in the cleansing solution through the discharge port 21b, even a cleansing solution which is liable to generate bubbles can be used in the present Embodiment.

Additionally, in the apparatus 1, the semiconductor substrate 30 is not moved after the cleansing treatment, the substrate 30 is located horizontally, and further, the turn of the table 3 is controlled to be stopped prior to the injection of the pure water. As a result, the pure water can remain on the substrate 30 till the start of drying treatment, thus keeping the cleanness of the substrate 30.

Second Embodiment

Figure 4:
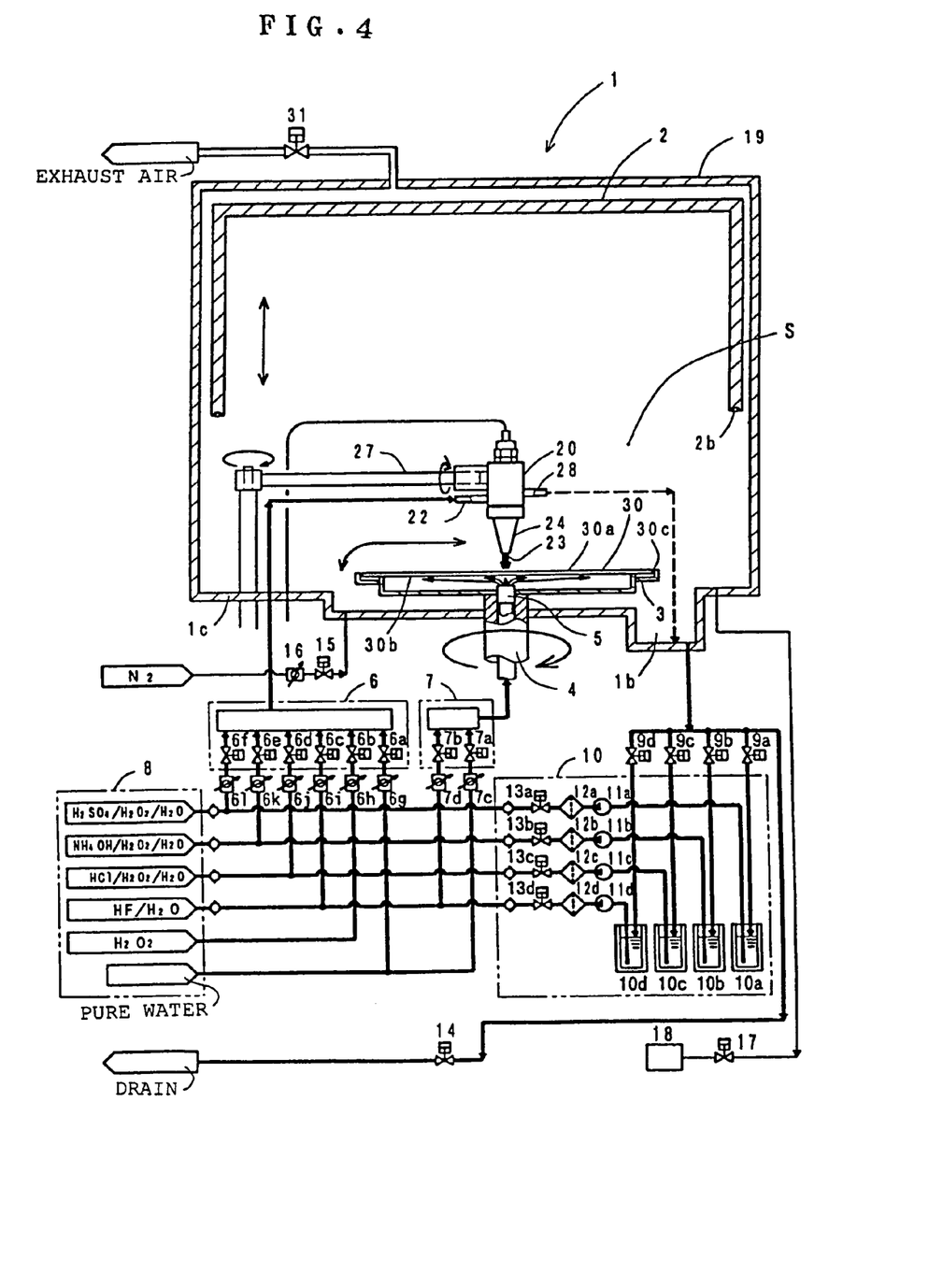
FIG. 4 is a cross-sectional view showing a cleansing apparatus in a second Embodiment.

FIG. 4 is a cross-sectional view showing a cleansing apparatus in a second Embodiment.

In the present Embodiment, a cover 2 is greater than that in the first Embodiment, and therefore, it can contain therein not only a table 3 and a semiconductor substrate 30 but also a high frequency solution injector 20, an arm 27 and a rotary shaft connected to the arm 27. The above-described constituent elements can be tightly enclosed by descending the cover 2. Except for this feature, a cleansing apparatus in the present Embodiment is configured in the same manner as that in the first Embodiment.

In the present Embodiment, the cover 2 is descended immediately after cleansing solutions are injected from the injector 20 and a lower nozzle 5, thereby tightly enclosing therein the table 3, the semiconductor substrate 30, the injector 20, the arm 27 and the rotary shaft. Pure water can be injected onto the substrate 30 inside of an airtight space, and subsequently, the substrate 30 can be subjected to a drying treatment. Consequently, in the present Embodiment, it is possible to completely prevent any contact with air outside of the cover 2 in the state in which the substrate 30 is wet. Moreover, in the present Embodiment, the injector 20, the arm 27 and the rotary shaft cannot interfere with the tight enclosure, and therefore, it is unnecessary to move the injector 20 to the outside of the cover 2 in order to tightly enclose the substrate 30. Thus, operation becomes simpler than that in the apparatus in the first Embodiment, which is advantageous in view of a process.

Third Embodiment

Figure 5:
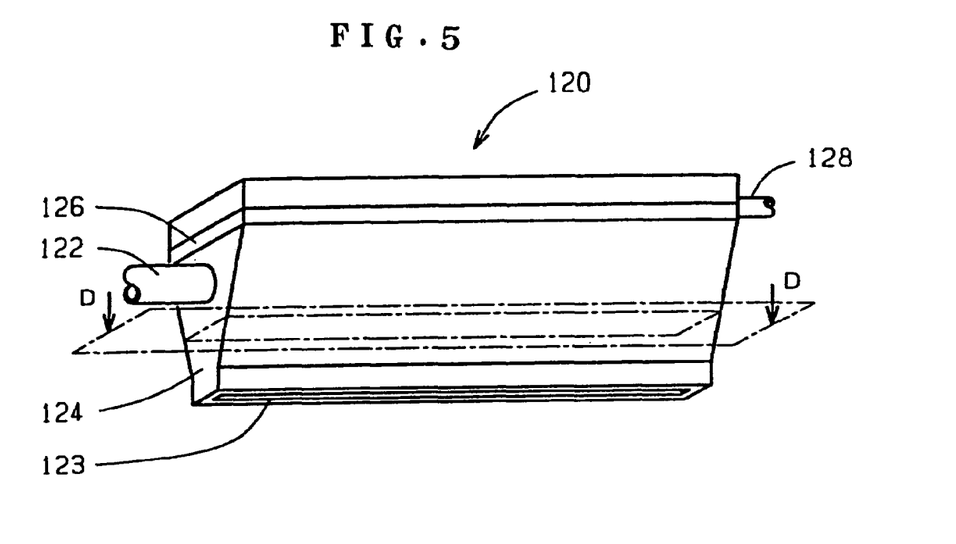
FIG. 5 is a perspective view showing a high frequency solution injector in a third Embodiment.
Figure 6:
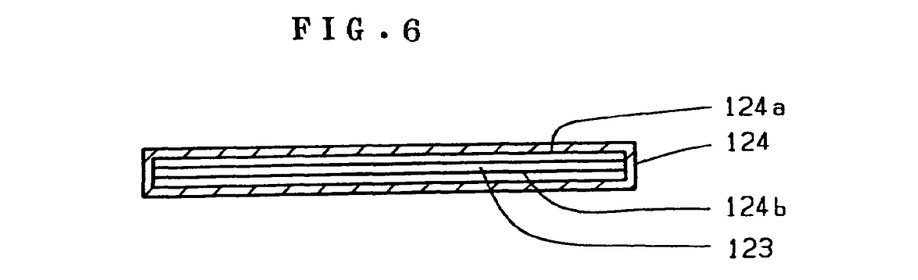
FIG. 6 is a cross-sectional view taken along a line D—D in FIG. 5.

A cleansing apparatus in a third Embodiment is identical to that in the first Embodiment except for a high frequency solution injector. FIG. 5 is a perspective view showing a high frequency solution injector in the present Embodiment; and FIG. 6 is a cross-sectional view taken along a line D—D in FIG. 5.

A high frequency solution injector 120 is provided with a nozzle 124 having both end surfaces formed into a substantially trapezoidal shape. The length of an injection port 123 is substantially equal to the radius of a table 3, wherein the injection port 123 is formed into an elongated slit having a predetermined width. At one end surface of the nozzle 124 is formed a supply port communicating with a supply pipe 122; in contrast, above the nozzle 124 is disposed a vibrator 126 which is vibrated at a high frequency of 800 kHz to 2 MHz. Therefore, a cleansing solution to be supplied from the supply port is injected from the injection port 123 while being vibrated at the high frequency by the vibrator 126.

Furthermore, at an end surface facing to the supply port in the nozzle 124 is formed a discharge port communicating with a discharge pipe 128. The upper end edge of the discharge port is located at a position higher than a solution contact surface of the vibrator 126. Therefore, bubbles generated in the cleansing solution cannot stay at the solution contact surface, but can be discharged outside through the discharge port. The nozzle of the injector 120 consists of a first passage 124a, which is gradually narrowed toward the injection port 123, and a rectangular second passage 124b of a given size, which connects the first passage 124a and the injection port 123 to each other. Thus, the injector 120 can inject straight the cleansing solution in a ribbon-like manner by a substantially constant cleansing force at a long and stable distance of a cleansing effective portion.

In the cleansing apparatus in the present Embodiment, the injector 120 is set in such a manner that the injection port 123 is parallel to a diametrical direction of the table 3 and one end of the injection port 123 is located above the center of the table 3. The upper surface of the substrate 30 is cleansed by turning the table 3 and injecting the cleansing solution from the injector 120.

In the above-described cleansing treatment, the cleansing solution can be dispersed over the entire upper surface of the substrate 30 by turning the table 3 and the substrate 30 only once. Consequently, in the present Embodiment, the substrate 30 can be cleansed in a short time. Furthermore, the cleansing solution can be injected all the time at the center of the upper surface of the substrate 30 during the cleansing treatment. Therefore, even if the cleansing solution staying at the upper surface is dispersed to the marginal portion of the substrate 30 by the turn, the cleansing solution cannot become short at the center. Thus, the central portion at the upper surface of the substrate 30 cannot be dried, and therefore, can be prevented from being contaminated.

Incidentally, although the length of the injection port 123 is set to be substantially equal to the radius of the table 3 in the present Embodiment, it may be set substantially to the diameter of the table. In this case, even if the table 3 and the semiconductor substrate 30 are not turned, the entire upper surface of the substrate 30 can be cleansed over by moving the injector 120 from end to end of the semiconductor substrate 30 only once.

Fourth Embodiment

Figure 7:
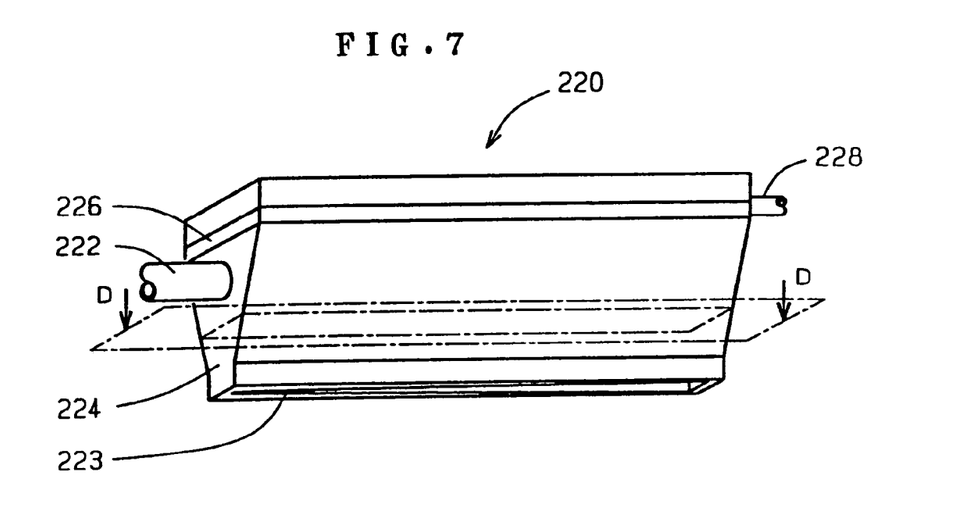
FIG. 7 is a perspective view showing a high frequency solution injector in a fourth Embodiment.
Figure 8:
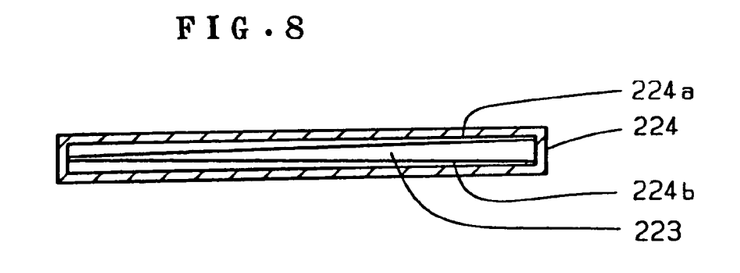
FIG. 8 is a cross-sectional view taken along a line D—D in FIG. 7.

FIG. 7 is a perspective view showing a high frequency solution injector in a fourth Embodiment; and FIG. 8 is a cross-sectional view taken along a line D-D in FIG. 7.

In a high frequency solution injector 220, an injection port 223 is formed into a wedged shape, in which the opening width thereof is varied along a longitudinal direction: namely, the opening width is smaller at the center of a table 3; in contrast, it is greater at a peripheral edge. Except for this feature, a cleansing apparatus in the present Embodiment is identical to that in the third Embodiment.

In the cleansing apparatus in the present Embodiment, the table 3 and a substrate 30 are turned during a cleansing treatment, like in the third Embodiment. When the substrate 30 is turned, the speed of the substrate 30 becomes higher apart from the center. Consequently, the amount of cleansing solution to be injected per unit area becomes smaller toward the marginal portion of the substrate 30 in the third Embodiment, and therefore, the cleansing treatment is liable to be more insufficient at the marginal portion of the substrate 30 than at the center. In contrast, since the opening width of the injection port 223 of the injector 220 is set to become greater toward the marginal portion of the table 3 or the substrate 30 in the present Embodiment, the amount of cleansing solution to be injected at the same time becomes greater at the marginal portion of the substrate 30 than that at the center. Thus, it is possible to uniformly cleanse the entire upper surface of the substrate 30 in the present Embodiment.

Fifth Embodiment

Figure 9:
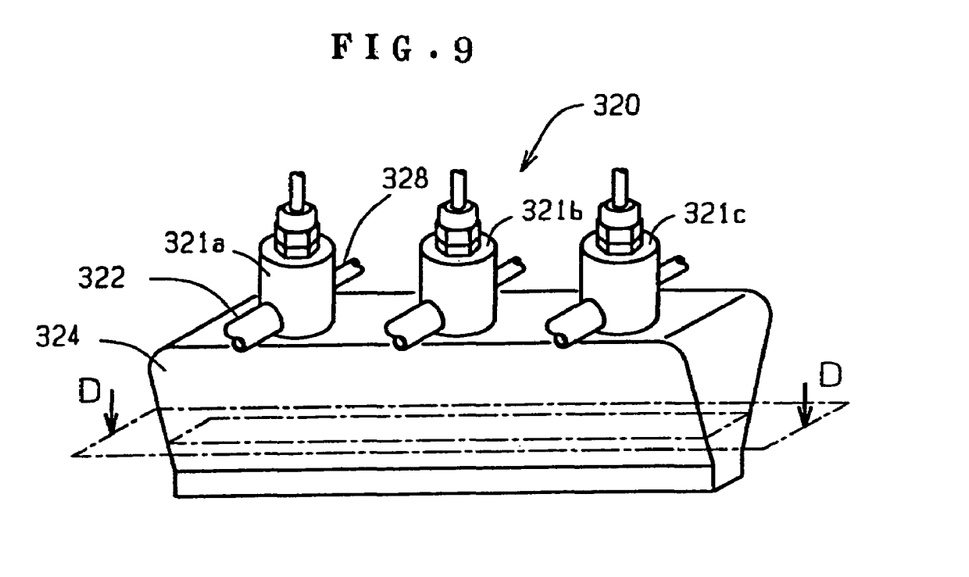
FIG. 9 is a perspective view showing a high frequency solution injector in a fifth Embodiment.
Figure 10:
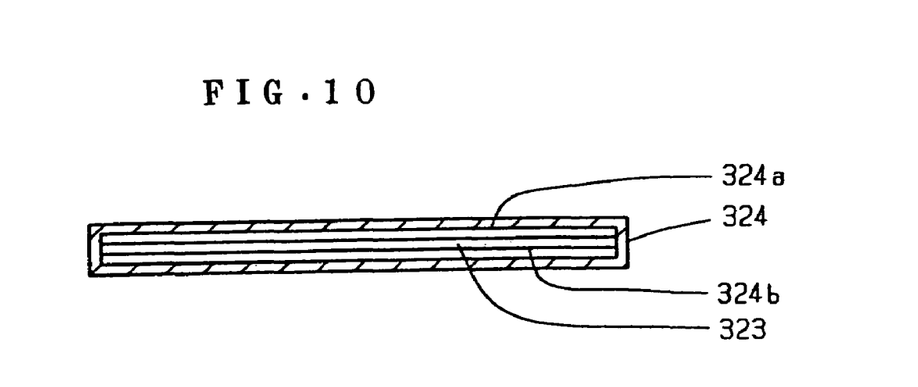
FIG. 10 is a cross-sectional view taken along a line D—D in FIG. 9.

FIG. 9 is a perspective view showing a high frequency solution injector in a fifth Embodiment; and FIG. 10 is a cross-sectional view taken along a line D—D in FIG. 9.

A high frequency solution injector 320 is provided with a nozzle 324 and three cylindrical cases 321a, 321b and 321c disposed above the nozzle 324. The structure of the nozzle 324 is identical to that of the nozzle 124 in the third Preferred Embodiment shown in FIGS. 5 and 6. The structure of each of the cases 321a, 321b and 321c is identical to that of the case 21 in the first Embodiment shown in FIGS. 2 and 3. Inside of each of the cases 321a, 321b and 321c, there are provided a vibrator, which is vibrated at a high frequency of 800 kHz to 2 MHz, and a holder, which is made of a chemically resistant material and liquid-tightly supports the vibrator, like in the first Embodiment. Except for these features, a cleansing apparatus in the present Embodiment is identical to that in the third Embodiment.

In the present Embodiment, the three vibrators are separately provided in the injector 320. Consequently, although the nozzle 324 is identical to that in the third Embodiment, the vibrator is smaller in size than that in the third Embodiment. Therefore, the vibrator in the present Embodiment is more excellent in durability than that in the third Embodiment, and further, is more reduced in cost. Furthermore, since the vibrator is small in size, the holder can be easily fabricated. Thus, it is possible to fabricate the injector 320 at a reduced cost in the present Embodiment.

Furthermore, since the three vibrators are provided in the present Embodiment, outputs from the vibrators can be independently set. Consequently, when a table 3 and a substrate 30 are turned during a cleansing treatment, the output of the vibrator is set to be low at the center of the table 3 while high at the peripheral edge thereof, so that the upper surface of the substrate 30 can be uniformly cleansed. Incidentally, although the three vibrators are provided in the present Embodiment, the number of vibrators is not limited to three. The number of vibrators may be appropriately set as long as the upper surface of the substrate 30 can be uniformly cleansed. Moreover, although a supply port and a supply pipe 322 communicating with the supply port are disposed in each of the cases 321a, 321b and 321c in the present Embodiment, they may be disposed at the side surface of the nozzle 324.

Sixth Embodiment

Figure 11:
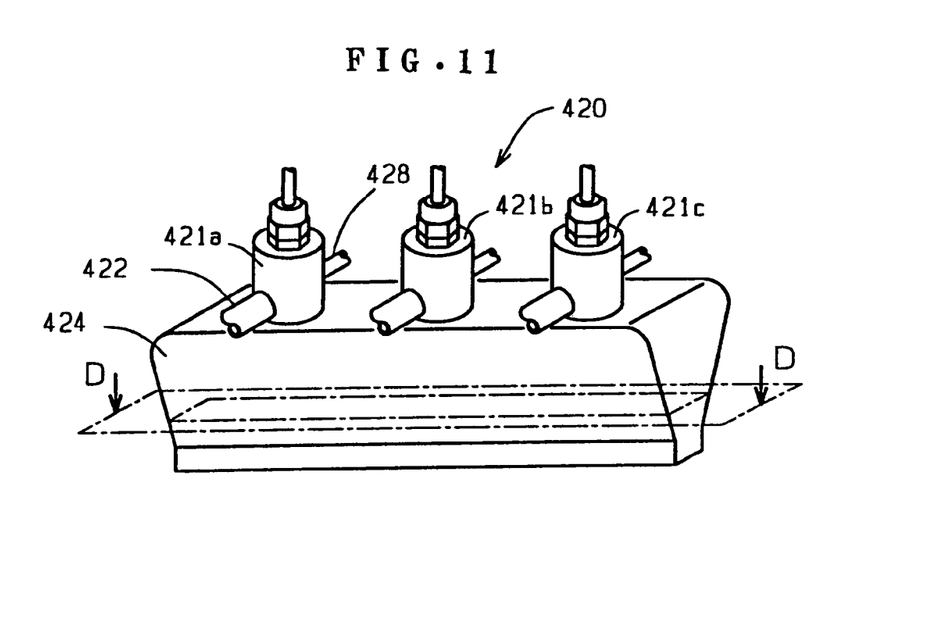
FIG. 11 is a perspective view showing a high frequency solution injector in a sixth Embodiment.
Figure 12:
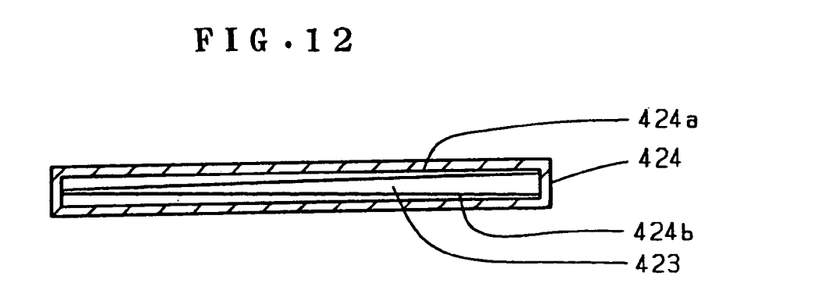
FIG. 12 is a cross-sectional view taken along a line D—D in FIG. 11.

FIG. 11 is a perspective view showing a high frequency solution injector in a sixth Preferred Embodiment; and FIG. 12 is a cross-sectional view taken along a line D—D in FIG. 11.

In a high frequency solution injector 420, an injection port 423 is formed into a wedged shape, in which the opening width thereof is varied along a longitudinal direction: namely, the opening width is smaller at the center of a table 3; in contrast, it is greater at the peripheral edge thereof. Except for this feature, a cleansing apparatus in the present Embodiment is identical to that in the fifth Embodiment.

In the present Embodiment, the injection port 423 is formed into a wedged shape, and further, three vibrators are provided. Thus, when the table 3 and a substrate 30 are turned during a cleansing treatment, the upper surface of the substrate 30 can be more uniformly cleansed than in the fourth and fifth Embodiments.

INDUSTRIAL APPLICABILITY

In the cleansing apparatus according to the present invention, the semiconductor substrate is dried while keeping the cleanness immediately after the cleansing treatment, so that the semiconductor substrate can be restrained from being oxidized or contaminated. Thus, it is possible to enhance the characteristics of a semiconductor device.

The invention claimed is:

1. A cleansing apparatus comprising:
    a table for supporting a semiconductor substrate horizontally;
    a high frequency solution injector capable of injecting a solution to an upper surface of the semiconductor substrate supported by the table with the application of vibration at high frequency and being movable;
    a cover capable of tightly enclosing the semiconductor substrate supported by the table and being able to be located apart from the substrate during cleansing of the substrate;
    pressure reducing means for reducing the pressure only in a space which is enclosed with the cover; and
    an air-tight container for containing therein the table, the high frequency solution injector and the cover.

2. A cleansing apparatus as claimed in claim 1, further comprising injector displacing means for moving the high frequency solution injector in parallel to the table, and further, inclining the high frequency solution injector with respect to the table.

3. A cleansing apparatus as claimed in claim 2, wherein the injector displacing means comprises:
    a swing shaft for swinging the high frequency solution injector within a plane parallel to the table; and
    an arm which is fixed at one end thereof perpendicularly to the swing shaft and has at the other end thereof the high frequency solution injector oscillatably fixed thereto.

4. A cleansing apparatus as claimed in claim 1, wherein an injection port of the high frequency solution injector is formed into a shape of a slit.

5. A cleansing apparatus as claimed in claim 4, wherein the opening width of the injection port of the high frequency solution injector is gradually increased along a longitudinal direction.

6. A cleansing apparatus as claimed in claim 1, wherein the high frequency solution injector has, in a horizontal direction, a plurality of vibrators for vibrating the solution.

7. A cleansing apparatus as claimed in claim 1, wherein the cover can also enclose the high frequency solution injector tightly.

8. A cleansing apparatus as claimed in claim 1, further comprising introducing means for introducing inactive gas into a space in which the semiconductor substrate is tightly enclosed with the cover.

9. A cleansing apparatus comprising:
    a table for supporting a semiconductor substrate horizontally;
    a high frequency solution injector capable of injecting a solution to an upper surface of the semiconductor substrate supported by the table with the application of vibration at high frequency;
    a cover capable of tightly enclosing the semiconductor substrate supported by the table;
    pressure reducing means for reducing the pressure only in a space which is enclosed with the cover;
    an air-tight container for containing therein the table, the high frequency solution injector and the cover;
    a plurality of branch pipes for supplying a plurality of kinds of chemical solutions, respectively;
    valves disposed in the branch pipes, respectively;
    confluent units for allowing the chemical solutions passing through the valves to be made confluent with each other; and
    a single main pipe passing through the container so as to connect the confluent units and the high frequency solution injector to each other.

10. A cleansing apparatus comprising:
    a table for supporting a semiconductor substrate horizontally;
    a high frequency solution injector capable of injecting a solution to an upper surface of the semiconductor substrate supported by the table with the application of vibration at high frequency;
    a cover capable of tightly enclosing the semiconductor substrate supported by the table, and being movable in a direction perpendicular to the table;

pressure reducing means for reducing the pressure only in a space which is enclosed with the cover; and an air-tight container for containing therein the table, the high frequency solution injector and the cover.

11. A cleansing apparatus of claim 10, wherein the cover can also enclose the high frequency solution injector tightly.

12. A cleansing apparatus of claim 10, further comprising introducing means for introducing inactive gas into a space in which the semiconductor substrate is tightly enclosed with the cover.

* * * * *